United States Patent
Fujiwara

[11] Patent Number: 5,236,811
[45] Date of Patent: Aug. 17, 1993

[54] METHOD OF PRODUCING A LAMBDA/4-SHIFTED DIFFRACTION GRATING

[75] Inventor: Masatoshi Fujiwara, Itami, Japan

[73] Assignee: Mitsubishi Denki Kabushiki Kaisha, Tokyo, Japan

[21] Appl. No.: 908,781

[22] Filed: Jul. 6, 1992

Related U.S. Application Data

[63] Continuation of Ser. No. 591,890, Oct. 2, 1990, abandoned.

[30] Foreign Application Priority Data

Apr. 19, 1990 [JP] Japan ................. 2-104039

[51] Int. Cl.$^5$ ............................. G03C 5/16
[52] U.S. Cl. ..................... 430/321; 430/330; 430/394
[58] Field of Search .......... 430/1, 2, 320, 321, 430/394, 330; 359/573, 566, 567

[56] References Cited

U.S. PATENT DOCUMENTS

| | | | |
|---|---|---|---|
| 3,888,672 | 6/1975 | Lee | 430/323 |
| 4,269,933 | 5/1981 | Pazos | 430/311 |
| 4,530,736 | 7/1985 | Mutter | 430/323 |
| 4,595,651 | 6/1986 | Grossa | 430/394 |
| 4,782,035 | 11/1988 | Fujiwara | 437/129 |
| 4,806,454 | 2/1989 | Yoshida et al. | 430/323 |
| 4,814,243 | 3/1989 | Ziger | 430/394 |
| 4,885,231 | 12/1989 | Chan | 430/323 |

OTHER PUBLICATIONS

Sze "Semiconductor Devices—Physics & Technology" pp. 428-458.

*Primary Examiner*—Charles L. Bowers, Jr.
*Assistant Examiner*—Martin Angebranndt
*Attorney, Agent, or Firm*—Leydig, Voit & Mayer

[57] ABSTRACT

A method of producing a λ/4 shifted diffraction grating, includes applying an image reversible resist on a substrate on which a diffraction grating is to be formed, exposing a predetermined with light of a first predetermined region of the resist with light of a first predetermined energy, exposing all of the resist with light interference fringes of a second predetermined energy, baking, and thereafter developing the image reversible resist.

2 Claims, 5 Drawing Sheets

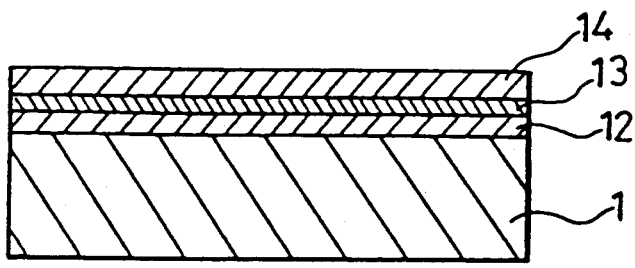
FIG. 2 (a) (PRIOR ART)
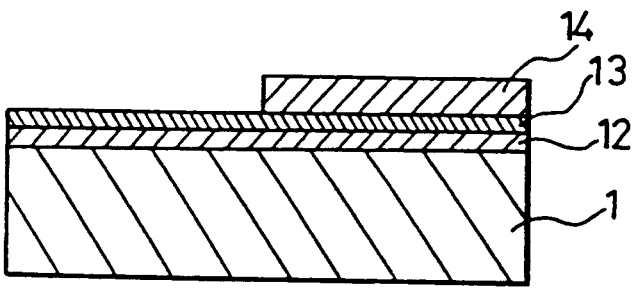
FIG. 2 (b) (PRIOR ART)
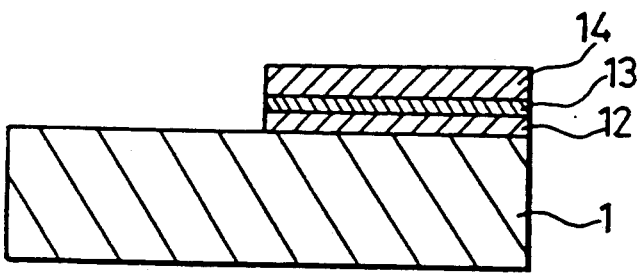
FIG. 2 (c) (PRIOR ART)
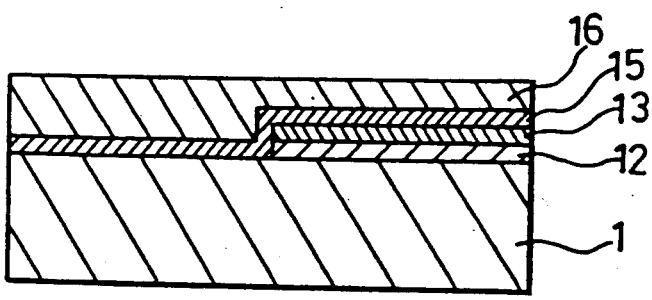
FIG. 2 (d) (PRIOR ART)

METHOD OF PRODUCING A LAMBDA/4-SHIFTED DIFFRACTION GRATING

This application is a continuation of application Ser. No. 07/591,890, filed Oct. 2, 1990, now abandoned.

FIELD OF THE INVENTION

The present invention relates to a method of producing a λ/4-shifted diffraction grating, and more particularly to a method of producing a λ/4-shifted diffraction grating in simplified steps.

BACKGROUND OF THE INVENTION

In order to make a distributed feedback laser that use of oscillates in a longitudinal fundamental mode, a λ/4-shifted region in a central portion of a diffraction grating in the laser has been generally known.

FIGS. 2(a) to 2(e) show the steps of a prior art method of producing a phase shift type diffraction grating. In these figures, reference numeral 1 designates a semiconductor substrate. A negative resist 12 is deposited on the substrate 1. An intermediate layer 13 is deposited on the negative resist 12 followed by a first positive resist 14. Intermediate layer 13 prevents mixing of the resists 12 and 14. OBC (Ohka Back Coating), which is of the same material as the negative resist, but which contains no photosensitive radicals, is used as the intermediate layer 13. Reference numeral 15 designates a second positive resist. An oxygen isolating film 16 is deposited on the second positive resist 15 for preventing the resist from chemically reacting with oxygen during exposure. PVA (Polyvinyl Alcohol), which is the same material as the positive resist, but which contains no photosensitive radicals, is used as the oxygen isolating film 16.

The production process will be described.

A negative resist 12, an intermediate layer 13, and a first positive resist 14 are deposited on a semiconductor substrate 1, as shown in FIG. 2 (a). A portion of the first positive resist 14 is then removed using ordinary photolithographic techniques, as shown in FIG. 2 (b). Utilizing a pattern of the first positive resist 14 as a mask, a portion of the intermediate layer 13 and a portion of the negative resist 12 are etched away by using a solution of nitric acid as an etchant, as shown in FIG. 2(c). The first positive resist 14 is removed and then a second positive resist 15 and an oxygen isolating film 16 are deposited, as shown in FIG. 2(d). In this state, exposure of layer 16 to interference fringes of light is made as shown in FIG. 2 (e), followed by development and rinsing, to form a pattern shown in FIG. 2(f) comprising the negative resist 12 and the second positive resist 15. The substrate 1 is etched utilizing this pattern as a mask and then the negative resist 12 and the second positive resist 15 are removed. Consequently, a phase shift type diffraction grating shown in FIG. 2 (g) is obtained.

The prior art method of producing a λ/4-shifted diffraction grating comprising the foregoing steps has disadvantages in that the steps are complicated and take much time.

SUMMARY OF THE INVENTION

It is an object of the present invention to provide a method of producing λ/4-shifted diffraction grating with simplified process steps.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to an aspect of the present invention, a method of producing a λ/4-shifted diffraction grating, utilizes an image reversible resist which shows a negative resist property below a predetermined exposure energy. A process for producing a resist pattern includes the steps of applying an image reversible resist on a substrate on which a diffraction grating is to be formed, exposing a predetermined region of the image reversible resist with light of a first predetermined energy, and thereafter of said image reversible resist with light interference fringes of a second predetermined energy, or alternatively, exposing all of the image reversible resist with light interference fringes of a second predetermined energy, and thereafter exposing a predetermined region of the image reversible resist with a first predetermined energy, baking the image reversible resist, and developing the resist. Thereby, a reversed pattern processing can be simplified. In addition, the precision of the diffraction grating can be enhanced.

DETAILED DESCRIPTION OF THE PREFERRED EMBODIMENT

Figure 1:
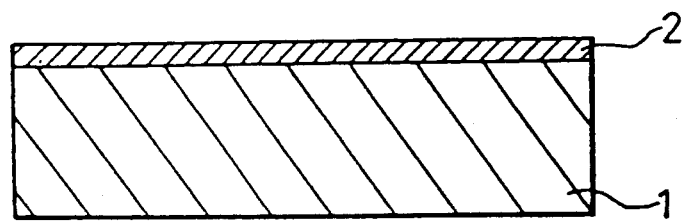
FIGS. 1(a) to 1(e) are cross-sectional views showing the steps of a method of manufacturing a λ/4 shifted diffraction grating according to an embodiment of the present invention.
Figure 1:
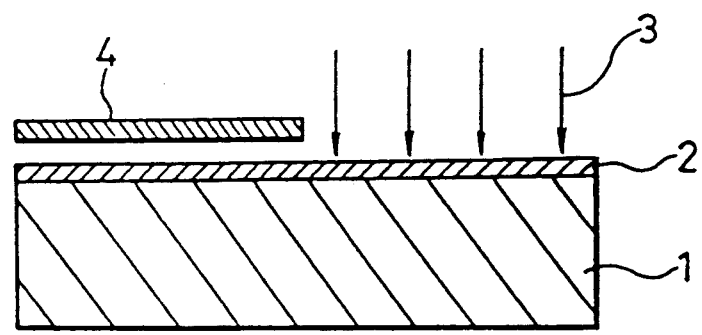
Figure 1:
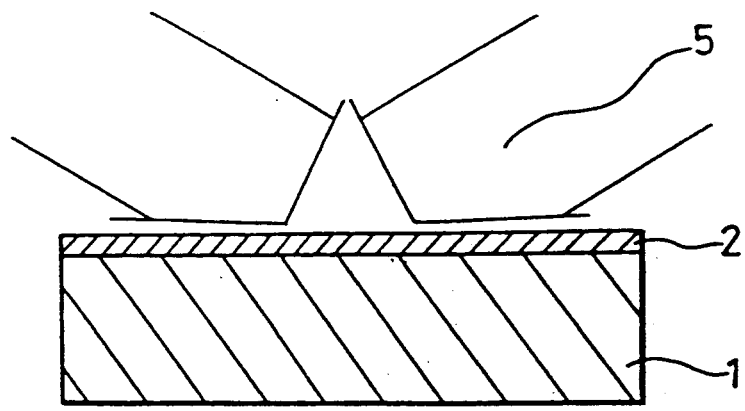
Figure 1:
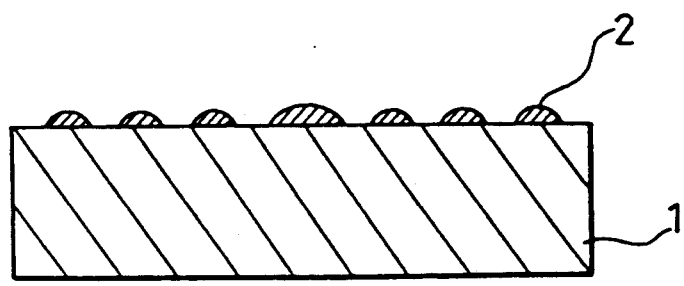
Figure 1:
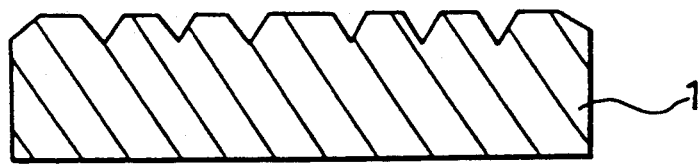
Figure 2:
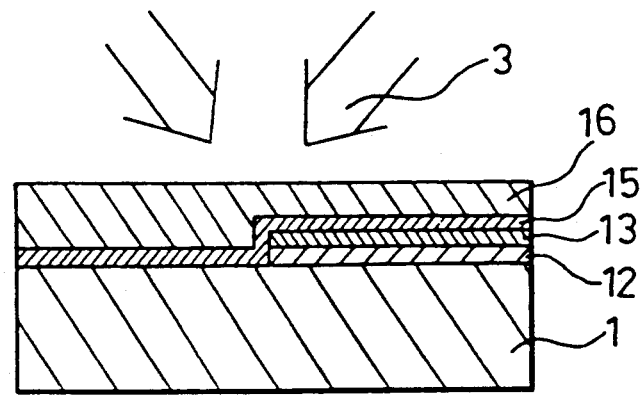
FIGS. 2(a) to 2(g) are cross-sectional views showing the steps of a prior art method of manufacturing a λ/4shifted diffraction grating.
Figure 2:
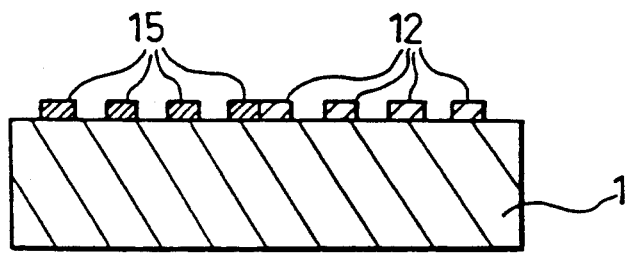
Figure 2:
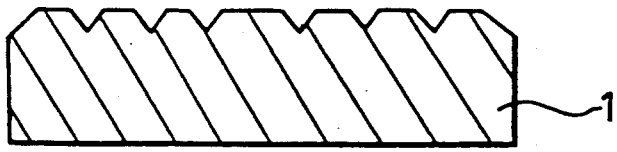

A method of producing a λ/4-phase shifted diffraction grating according to an embodiment of the present invention will be described with reference to the drawings.

FIG. 1(a) to (e) are cross-sectional views showing the steps of a method of manufacturing a λ/4-phase shifted diffraction grating according to an embodiment of the present invention. In these figures, reference numeral 1 designates a semiconductor substrate. An image reversible resist 2 is deposited on the substrate 1. Reference numeral 3 designates luminous flux for exposure. A mask 4 covers the reversible resist. Reference numeral 5 designates luminous flux for exposure which forms interference fringes. A specific example of the above described image reversible resist is AZ 5200.

The production process will be described.

An image reversible resist 2 is applied on a semiconductor substrate 1, as shown in FIG. 1 (a).

The property of image reversible resist, used in this embodiment, will be described.

Figure 3:
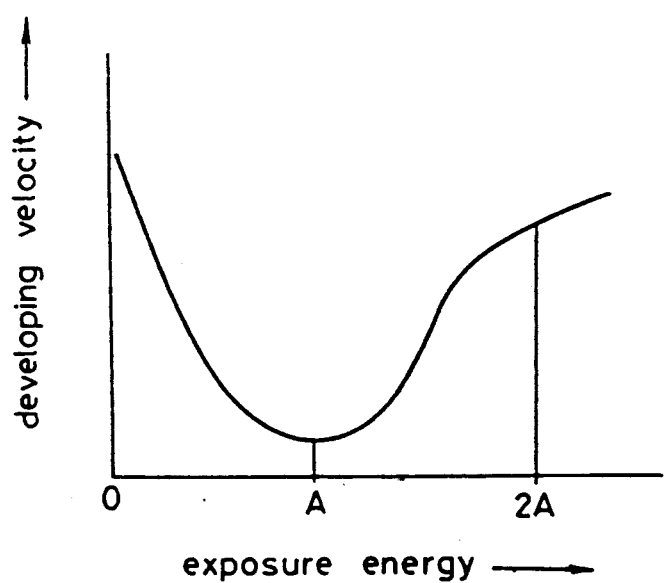
FIG. 3 shows the relation between exposure energy and developing velocity for an image reversible resist.

FIG. 3 shows the relation between exposure energy and developing velocity for an image reversible resist process (applying of resist → pre-baking → exposure → reversal baking → developing. The temperature of above described reversal baking is 120° C.), referring to "submicron processing by image reversal of positive type photoresist", which was reported in "Electronic Material" (June 1989).

As known from this figure, when exposure energy increases, developing velocity decreases. In other words, the negative resist properly appears until the exposure energy reaches after point A, while the positive resist properly appears after exposure energy exceeds point A.

Using the above described property, the substrate has simultaneously both a region of negative resist and another region of positive resist.

After performing pre-baking in the process of FIG. 1(a), a region of the substrate is covered by a mask 4, as shown in FIG. 1(b), and exposure is made by luminous flux 3 until the exposure energy reaches A shown in FIG. 3.

Thereafter, interference exposure is performed on all of resist 2 with energy of A in FIG. 3, as shown in FIG. 1(c). As the result, in a region exposed with luminous flux 3, the exposure energy at the bright interference exposure is 2A and the exposure energy at the dark interference exposure is A. On the other hand, in a region not exposed with luminous flux 3, all exposure energy at the bright interference exposure is A and the exposure energy at the non-exposed area is zero.

After interference exposure, reversal baking at 120° C. and developing are carried out. At a region exposed with luminous flux 3, the total exposure energy at the bright interference exposure amounts to 2A and the resist is removed, while the resist remains where the total exposure energy amounts to A. On the other hand, at a region which is not exposed with the light source 3, the total exposure energy at the bright portion of the interference exposure amounts to A and the resist remains, while the total exposure energy at the nonexposed portion amounts to zero and the resist is removed. In this way, the photosensitive property of the resist to interference exposure is reversed by exposure with luminous flux 3.

Thereafter, the resist pattern 2 is transferred onto the substrate 1. As shown in FIG. 1(d), the substrate 1 is etched utilizing the resist pattern 2 as a mask to form A diffraction grating on the substrate 1, and then the resist pattern 2 is removed. Thus, a diffraction grating is formed on the substrate 1, as shown in FIG. 1(e).

While in the above-described embodiment, interference exposure all of the substrate is performed after the substrate is exposed partially utilizing a mask, interference exposure can be performed before a part of a substrate is exposed utilizing a mask.

Furthermore, while in the above described embodiment, a λ/4-shifted diffraction grating is directly formed on a semiconductor substrate, a diffraction grating can be formed on another film such as an insulating film formed on a semiconductor substrate. Alternatively, a diffraction grating can be formed on one or multiple semiconductor layers, having compositions different from that of the semiconductor substrate, disposed on the semiconductor substrate.

As is evident from the foregoing description, according to the present invention, a method of manufacturing a λ/4-shifted diffraction grating utilizes an image reversal resist which shows A negative resist property below a predetermined exposure energy and A positive resist property above a predetermined exposure energy. A process for producing a resist pattern includes the steps of applying an image reversible resist on a substrate on which diffraction grating is to be formed, exposing a predetermined region of the image reversible resist with light of a first predetermined energy, and thereafter exposing all of said image reversible resist with light interference fringes of second predetermined energy, or alternatively, exposing all of said image reversible resist with light interference fringes of a second predetermined energy, and thereafter exposing a predetermined region of said image reversible resist with a first predetermined energy, baking the image reversible resist and developing the resist. Thereby, a reversed pattern can be formed with a single resist, so that the steps are simplified. In addition, the precision of the diffraction grating is enhanced.

What is claimed is:

1. A method of producing a diffraction grating including a λ/4 shifted region comprising sequentially:
   applying an image-reversible resist to a substrate on which a diffraction grating is to be formed, said image-reversible resist changing from a negative-type resist to a positivetype resist upon cumulative exposure to light energy approximately equal to A and to a negative-type resist upon cumulative exposure to light energy approximately equal to twice A;
   exposing a predetermined portion of said image-reversible resist with light energy of approximately A;
   exposing all of said image-reversible resist to a pattern of light interference fringes wherein the maximum light energy of the fringes is approximately A;
   baking said image-reversible resist;
   developing said image-reversible resist; and
   etching said substrate using said developed image-reversible resist as a mask to produce a λ/4 shifted diffraction grating.

2. The method of claim 1 including:
   before exposing a predetermined portion of said image-reversible resist to light, covering a portion of said image-reversible resist with a mask, leaving the predetermined portion of said image-reversible resist unmasked; and
   after exposing the predetermined portion of said image-reversible resist with light energy of approximately A, and before exposing all of said image-reversible resist to the pattern of interference fringes having a maximum light energy of approximately A, removing the mask.

* * * * *